US012684816B2

(12) United States Patent
Xie et al.

(10) Patent No.: US 12,684,816 B2
(45) Date of Patent: Jul. 14, 2026

(54) REDUCED GATE TOP CD WITH WRAP-AROUND GATE CONTACT

(71) Applicant: INTERNATIONAL BUSINESS MACHINES CORPORATION, Armonk, NY (US)

(72) Inventors: Ruilong Xie, Niskayuna, NY (US); Su Chen Fan, Cohoes, NY (US); Ravikumar Ramachandran, Pleasantville, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 814 days.

(21) Appl. No.: 17/964,115

(22) Filed: Oct. 12, 2022

(65) Prior Publication Data

US 2024/0128345 A1      Apr. 18, 2024

(51) Int. Cl.
| | |
|---|---|
| *H01L 29/423* | (2006.01) |
| *H10D 30/67* | (2025.01) |
| *H10D 84/01* | (2025.01) |
| *H10D 84/03* | (2025.01) |
| *H10W 20/00* | (2026.01) |

(52) U.S. Cl.
CPC ..... *H10D 30/6735* (2025.01); *H10D 30/6757* (2025.01); *H10D 84/0186* (2025.01); *H10D 84/038* (2025.01); *H10W 20/063* (2026.01); *H10W 20/077* (2026.01)

(58) Field of Classification Search
CPC .......... H10D 30/6735; H10D 30/6757; H10D 84/0186; H10D 84/038; H10D 30/62; H10D 84/0147; H10D 84/0149; H10D 84/83; H01L 21/76834; H01L 21/76885; H01L 21/76897
See application file for complete search history.

(56) References Cited

U.S. PATENT DOCUMENTS

| | | | |
|---|---|---|---|
| 9,412,840 | B1 | 8/2016 | Leobandung et al. |
| 9,818,876 | B1 | 11/2017 | Bouche et al. |
| 10,665,692 | B2 | 5/2020 | Xie et al. |
| 10,832,964 | B1 | 11/2020 | Xie et al. |
| 10,861,950 | B2 | 12/2020 | Sengupta et al. |
| 10,930,568 | B1 | 2/2021 | Xie et al. |
| 2017/0077256 | A1 | 3/2017 | Adusumilli et al. |
| 2020/0152751 | A1 | 5/2020 | Greene et al. |
| 2023/0378263 | A1* | 11/2023 | Jang ...................... H10D 30/43 |

* cited by examiner

*Primary Examiner* — Cuong B Nguyen
(74) *Attorney, Agent, or Firm* — Harrity & Harrity, LLP

(57) ABSTRACT

A semiconductor structure is presented including a plurality of field effect transistor (FET) devices, each FET device having a different gate threshold voltage, first spacers disposed on sidewalls of each FET device, second spacers disposed over and in direct contact with the first spacers, the second spacers having a width greater than a width of the first spacers, and a gate contact directly contacting an FET device of the plurality of FET devices, where only an upper portion of the gate contact directly contacts third spacers on opposed ends thereof. The second spacers can have a bi-layer configuration and the gate contact wraps around a top portion of the FET device in direct contact with the gate contact.

10 Claims, 13 Drawing Sheets

REDUCED GATE TOP CD WITH WRAP-AROUND GATE CONTACT

BACKGROUND

The present invention relates generally to semiconductor devices, and more specifically, to constructing reduced gate top critical dimensions (CDs) with a wrap-around gate contact.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demands for miniaturization, higher speed, greater bandwidth, lower power consumption, and lower latency, chip layout has become more complicated and difficult to achieve in the production of semiconductor dies.

SUMMARY

In accordance with an embodiment, a semiconductor structure is provided. The semiconductor structure includes a plurality of field effect transistor (FET) devices, each FET device having a different gate threshold voltage, first spacers disposed on sidewalls of each FET device, second spacers disposed over and in direct contact with the first spacers, the second spacers having a width greater than a width of the first spacers, and a gate contact directly contacting an FET device of the plurality of FET devices, where only an upper portion of the gate contact directly contacts third spacers on opposed ends thereof.

In accordance with another embodiment, a semiconductor structure is provided. The semiconductor structure includes a plurality of field effect transistor (FET) devices, each FET device having a different gate threshold voltage, first spacers disposed on sidewalls of each FET device, second spacers disposed over and in direct contact with the first spacers, the second spacers having a bi-layer configuration, and a gate contact directly contacting an FET device of the plurality of FET devices, where only an upper portion of the gate contact directly contacts third spacers on opposed ends thereof.

In accordance with yet another embodiment, a method for forming a semiconductor structure is provided. The method includes constructing a plurality of field effect transistor (FET) devices, each FET device having a different gate threshold voltage, forming first spacers on sidewalls of each FET device, forming second spacers over and in direct contact with the first spacers, the second spacers having a width greater than a width of the first spacers, and disposing a gate contact in direct contact with an FET device of the plurality of FET devices, where only an upper portion of the gate contact directly contacts third spacers on opposed ends thereof.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing reduced gate top critical dimensions (CDs) with a wrap-around gate contact. The exemplary methods and structures are enabled by forming a reduced gate top CD by employing a local enlarged gate spacer and a reduced gate contact CD by employing inner spacers, as well as constructing a wrap-around gate contact for middle-of-line (MOL) scaling. The exemplary embodiments of the present invention achieve a similar MOL litho process window at a smaller contacted poly pitch (CPP) compared to existing technology with a larger gate pitch. The advantages of the exemplary embodiments of the present invention include at least not needing aggressive gate length (Lg) reduction, which compromises short channel effect (SCE), and not needing aggressive source/drain contact (CA) size reduction, which compromises ON-state resistance ($R_{on}$). Moreover, the exemplary structures only shrink the top gate CD and gate contact (CB) size, parameters which affect performance the least. However, the weakness of only shrinking the top gate CD and CB size can be mitigated by using a bi-layer top spacer followed by selectively removing the first layer after CB reactive ion etch (RIE) to recover the CB to gate contact dimension.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. D-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
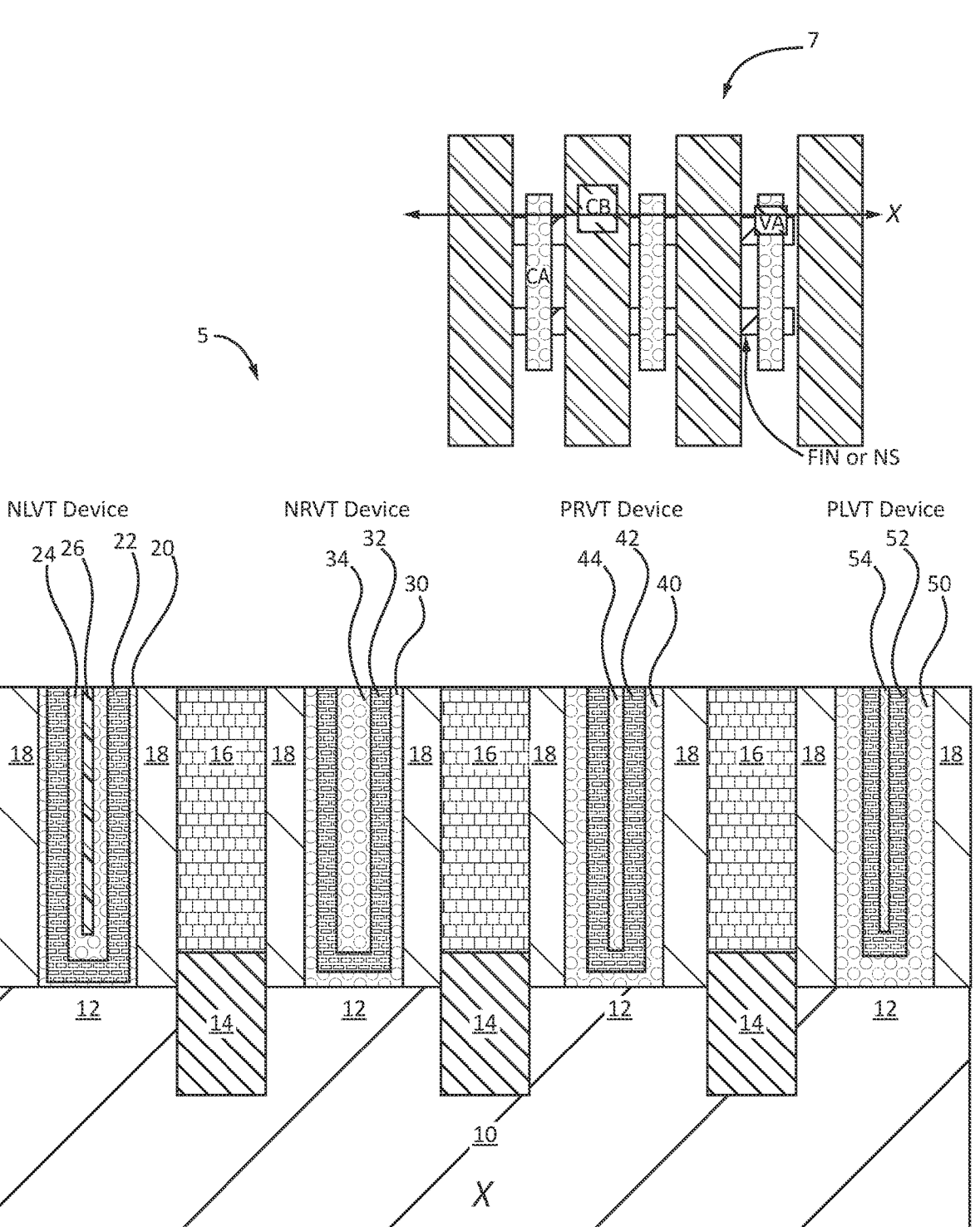
FIG. 1 is a cross-sectional view of a semiconductor structure including an NFET low voltage threshold (NLVT) device, an NFET regular voltage threshold (NRVT) device, a PFET regular voltage threshold (PRVT) device and a PFET low voltage threshold (PLVT) device, in accordance with an embodiment of the present invention.

FIG. 1 is a cross-sectional view of a semiconductor structure including an NFET low voltage threshold (NLVT) device, an NFET regular voltage threshold (NRVT) device, a PFET regular voltage threshold (PRVT) device and a PFET low voltage threshold (PLVT) device, in accordance with an embodiment of the present invention.

In various example embodiments, a semiconductor structure 5 includes an NFET low voltage threshold (NLVT) device, an NFET regular voltage threshold (NRVT) device, a PFET regular voltage threshold (PRVT) device and a PFET low voltage threshold (PLVT) device. These devices are field effect transistor (FET) devices that are constructed over a substrate 10 defining fin channels 12. The NLVT, NRVT, PRVT, and PLVT devices are separated from each other by an interlayer dielectric (ILD) 16 formed over source/drain (S/D) epi regions 14. The S/D epi regions 14 extend into the substrate 10. Spacers 18 are formed on opposed ends of the NLVT, NRVT, PRVT, and PLVT devices. Sidewalls of the spacers 18 directly contact sidewalls of the ILD 16. Sidewalls of the spacers 18 further directly contact top sidewall sections of the S/D epi regions 14. The spacers 18 can also be referred to as sidewall spacers.

The NLVT device includes a first work function metal (WFM) layer 20, a second WFM layer 22, and a third WFM layer 24. The first WFM layer 20 is the outermost layer that directly contacts the sidewalls of the spacers 18. It is noted that a thin high-k dielectric layer (not shown), such as $HfO_2$, is also present between the outermost WFM layer (20, 30, 40, 50) of the devices and the spacers 18. The second WFM layer 22 rests within the first WFM layer 20. The third WFM layer 24 rests within the second WFM layer 22. A conductive material 26 is deposited within the third WFM layer 24. The first, second, and third WFM layers 20, 22, 24 each define a substantially U-shaped configuration. Additionally, the first, second, and third WFM layers 20, 22, 24 collectively define a substantially U-shaped configuration. The conductive material 26 defines a substantially linear configuration. The third WFM layer 24 and the second WFM layer 22 have thicknesses that are greater than the thickness of the first WFM layer 20.

The NRVT device includes a first WFM layer 30, a second WFM layer 32, and a third WFM layer 34. The first WFM layer 30 is the outermost layer that directly contacts the sidewalls of the spacers 18. It is noted that a thin high-k dielectric layer (not shown), such as $HfO_2$, is also present between the outermost WFM layer (20, 30, 40, 50) of the devices and the spacers 18. The second WFM layer 32 rests within the first WFM layer 30. The third WFM layer 34 rests within the second WFM layer 32. The first and second WFM layers 30, 32 each define a substantially U-shaped configuration. Additionally, the first and second WFM layers 30, 32 collectively define a substantially U-shaped configuration. The third WFM layer 34 defines a substantially linear configuration. The second WFM layer 32 has a thickness that is greater than the thickness of the first WFM layer 30. The third WFM layer 34 can have a thickness approximately equal to the thickness of the second WFM layer 32.

The PRVT device includes a first WFM layer 40, a second WFM layer 42, and a third WFM layer 44. The first WFM layer 40 is the outermost layer that directly contacts the sidewalls of the spacers 18. It is noted that a thin high-k dielectric layer (not shown), such as $HfO_2$, is also present between the outermost WFM layer (20, 30, 40, 50) of the devices and the spacers 18. The second WFM layer 42 rests within the first WFM layer 40. The third WFM layer 44 rests within the second WFM layer 42. The first and second WFM layers 40, 42 each define a substantially U-shaped configuration. Additionally, the first and second WFM layers 40, 42 collectively define a substantially U-shaped configuration. The third WFM layer 44 defines a substantially linear configuration.

It is noted that the third WFM layer 34 of the NRVT device has a thickness greater than the thickness of the third WFM layer 44 of the PRVT device. It is further noted that the first WFM layer 30 of the NRVT device has a thickness less than the thickness of the first WFM layer 40 of the of the PRVT device.

The PLVT device includes a first WFM layer 50, a second WFM layer 52, and a third WFM layer 54. The first WFM layer 50 is the outermost layer that directly contacts the sidewalls of the spacers 18. It is noted that a thin high-k dielectric layer (not shown), such as HfO$_2$, is also present between the outermost WFM layer (20, 30, 40, 50) of the devices and the spacers 18. The second WFM layer 52 rests within the first WFM layer 50. The third WFM layer 54 rests within the second WFM layer 52. The first and second WFM layers 50, 52 each define a substantially U-shaped configuration. Additionally, the first and second WFM layers 50, 52 collectively define a substantially U-shaped configuration. The third WFM layer 54 defines a substantially linear configuration. The first WFM layer 50 has a thickness that is greater than the thickness of the second WFM layer 52 and the third WFM layer 54.

It is noted that the third WFM layer 44 of the PRVT device has a thickness greater than the thickness of the third WFM layer 54 of the PLVT device. It is further noted that the first WFM layer 50 of the PLVT device has a greater thickness than the thickness of the first WFM layer 40 of the of the PRVT device.

Therefore, the thickness of the third WFM layer 34 of the NRVT device is greater than a thickness of the third WFM layer 44 of the PRVT device, which in turn has a thickness greater than the thickness of the third WFM layer 54 of the PLVT device. Similarly, the thickness of the first WFM layer 50 of the PLVT device is greater than a thickness of the first WFM layer 40 of the PRVT device, which in turn has a thickness greater than the thickness of the first WFM layer 30 of the NRVT device. The advantage of this configuration is that there is no need for WFM chamfering, which is a challenging process for devices with short Lg at CPP of less than 45 nm. This configuration creates four devices each with a different gate threshold voltage.

The first WFM layer 20 of the NLVT device, the first WFM layer 30 of the NRVT device, the first WFM layer 40 of the PRVT device and the first WFM layer 50 of the PLVT device can be, e.g., titanium nitride (TiN) layers. The second WFM layer 22 of the NLVT device, the second WFM layer 32 of the NRVT device, the second WFM layer 42 of the PRVT device and the second WFM layer 52 of the PLVT device can be, e.g., titanium carbide (TiC, or TiAlC) layers. The third WFM layer 24 of the NLVT device, the third WFM layer 34 of the NRVT device, the third WFM layer 44 of the PRVT device and the third WFM layer 54 of the PLVT device can be, e.g., TiN layers. The conductive material 26 can be, e.g., tungsten (W). It is noted that four types of devices (NLVT, NRVT, PRVT, PLVT) are listed, and this is only for illustration purposes, and the invention process and structures also work for more types of transistors with different threshold voltages.

The top view 7 illustrates the fins in relation to the gates and the CA, CB, and VA contacts.

In one or more embodiments, the substrate 10 can be a semiconductor or an insulator with an active surface semiconductor layer. The substrate 10 can be crystalline, semicrystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The ILD 16 can be any suitable material, such as, for example, porous silicates, carbon doped oxides, silicon dioxides, silicon nitrides, silicon oxynitrides, or other dielectric materials. Any known manner of forming the ILD 16 can be utilized. The ILD 16 can be formed using, for example, CVD, PECVD, ALD, flowable CVD, spin-on dielectrics, or PVD.

The S/D epi regions 14 can be of the same or different materials for pFET and nFET devices, and can be either in-situ doped with appropriate polarity dopants (B for pFET and P for nFET devices) or doped by ion implantation.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The spacers 18 can include any of one or more of SiN, SiBN, SiCN and/or SiBCN films.

The WFMs 20, 22, 24, 30, 32, 34, 40, 42, 44, 50, 52, 54 can be metals, such as, e.g., TiN, TiC, TiAl, TiAlC, TaN, or any combination thereof. The metal can be deposited by a suitable deposition process, for example, ALD, chemical vapor deposition (CVD), plasma enhanced chemical vapor deposition (PECVD), physical vapor deposition (PVD), plating, thermal or e-beam evaporation, or sputtering. In various exemplary embodiments, the height of the WFMs 20, 22, 24, 30, 32, 34, 40, 42, 44, 50, 52, 54 can be reduced by chemical-mechanical polishing (CMP) and/or etching. Therefore, the planarization process can be provided by CMP. Other planarization process can include grinding and polishing.

Figure 2:
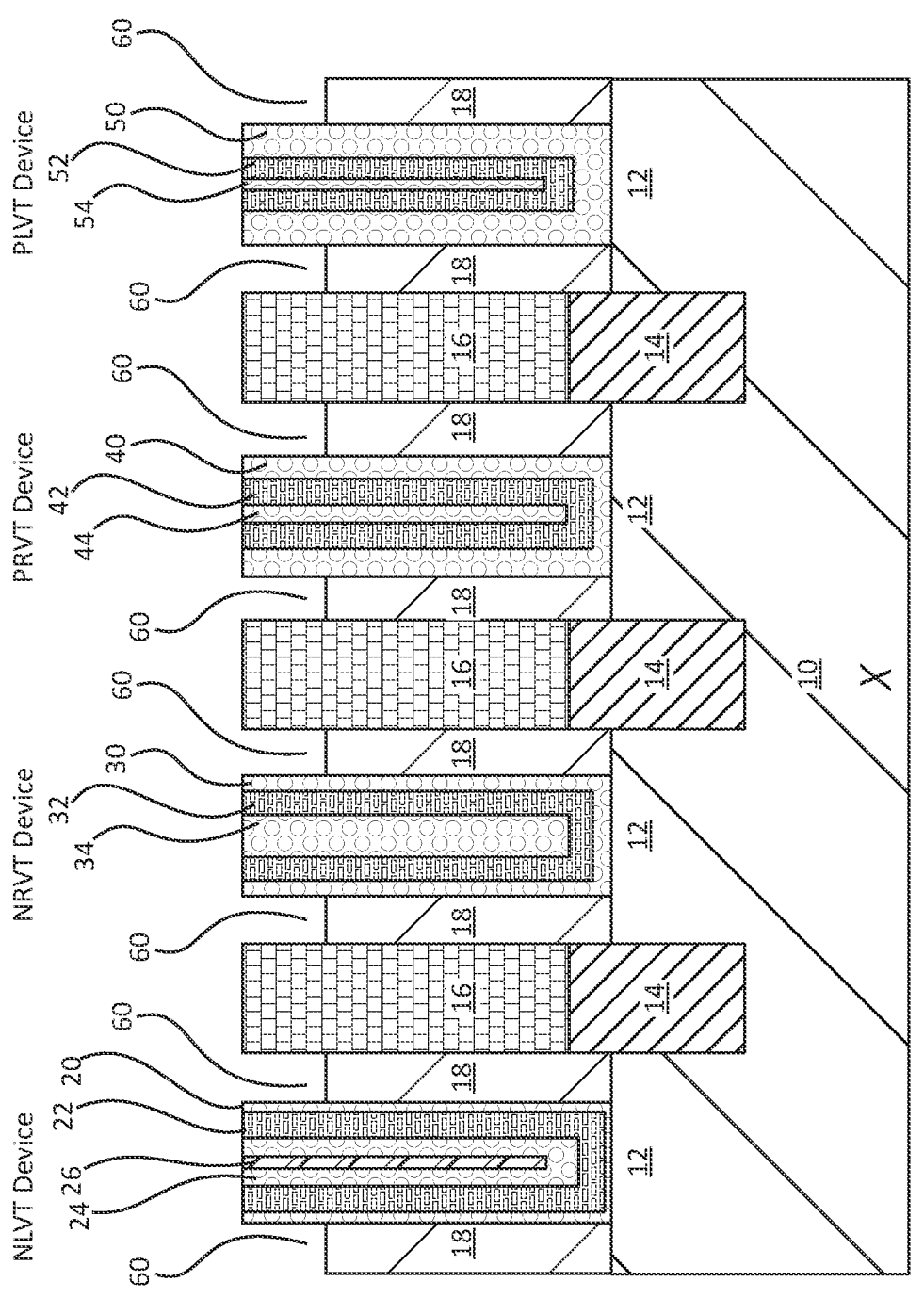
FIG. 2 is a cross-sectional view of the semiconductor structure of FIG. 1 where the spacers adjacent the NLVT, NRVT, PRVT, and PLVT devices are selectively recessed, in accordance with an embodiment of the present invention.

FIG. 2 is a cross-sectional view of the semiconductor structure of FIG. 1 where the spacers adjacent the NLVT, NRVT, PRVT, and PLVT devices are selectively recessed, in accordance with an embodiment of the present invention.

In various example embodiments, the spacers 18 adjacent the NLVT, NRVT, PRVT, and PLVT devices are selectively recessed to create openings 60 at top portions of the NLVT, NRVT, PRVT, and PLVT devices. The recessing exposes the sidewalls of the first WFM layer 20 of the NLVT device, the sidewalls of the first WFM layer 30 of the NRVT device, the sidewalls of the first WFM layer 40 of the PRVT device, and the sidewalls of the first WFM layer 50 of the PLVT device.

The etching can include a dry etching process such as, for example, wet etch, reactive ion etching, plasma etching, ion etching or laser ablation. The etching can further include a wet chemical etching process in which one or more chemical etchants are used to remove portions of the blanket layers that are not protected by the patterned photoresist.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 3:
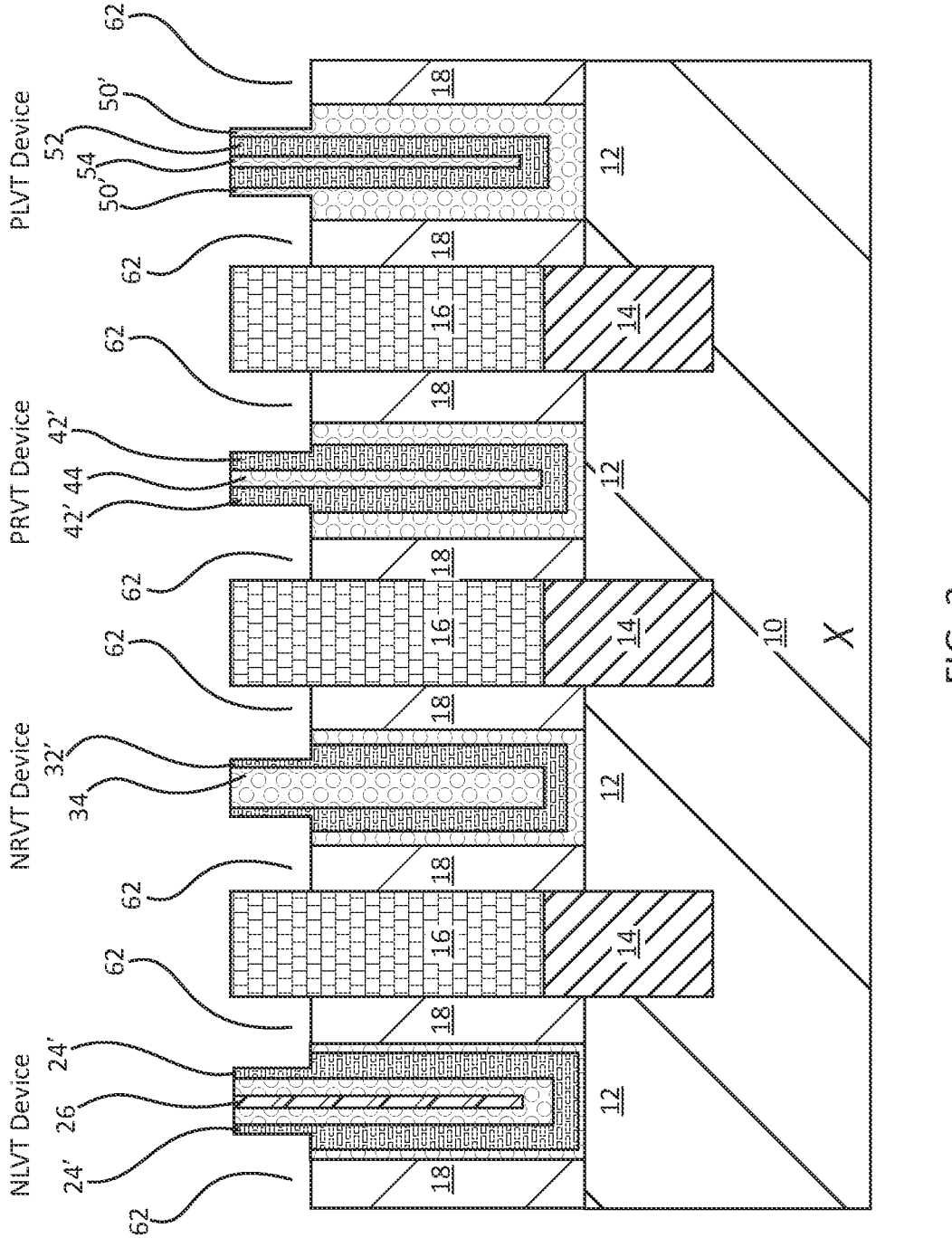
FIG. 3 is a cross-sectional view of the semiconductor structure of FIG. 2 where an isotropic etch is performed to selectively remove portions of work function metals (WFMs), in accordance with an embodiment of the present invention.

FIG. 3 is a cross-sectional view of the semiconductor structure of FIG. 2 where an isotropic etch is performed to selectively remove portions of work function metals (WFMs), in accordance with an embodiment of the present invention.

In various example embodiments, an isotropic etch is performed to selectively remove portions of WFMs of the NLVT, NRVT, PRVT, and PLVT devices to create wider openings 62. The isotropic etch can shrink the gate top critical dimension (CD) uniformly despite the composition of the WFMs for different devices with different gate threshold voltages. This can be achieved by tuning the etch process such that the etch rates of various WFM layers are similar. For example, if the WFM layers include TiN and TiAlC, a citric-peroxide wet etch chemistry can be used at a proper mix ratio and temperature to achieve a 1:1 etch rate ratio between the TiN and the TiAlC.

In the NLVT device, the isotropic etch results in the first WFM layer 20 and the second WFM layer 22 being removed from the openings 62. The third WFM layer 24 is recessed to a recessed third WFM layer 24'. The conductive material 26 remains intact.

In the NRVT device, the isotropic etch results in the first WFM layer 30 being removed from the openings 62. The second WFM layer 32 is recessed to a thin recessed second WFM layer 32'. The third WFM layer 34 remains the same.

In the PRVT device, the isotropic etch results in the first WFM layer 40 being removed from the openings 62. The second WFM layer 42 is slightly recessed to a recessed second WFM layer 42'. The third WFM layer 44 remains the same.

In the PLVT device, the isotropic etch results in the first WFM layer 50 being recessed to a thin recessed first WFM layer 50'. The second and third WFM layers 52, 54 remain the same.

Therefore, the second WFM layer 52 of the PLVT device has a thickness greater than the thickness of the recessed second WFM layer 42' of the PRVT device, which in turn has a thickness greater than a thickness of the thin recessed second WFM layer 32' of the NRVT device.

Figure 4:
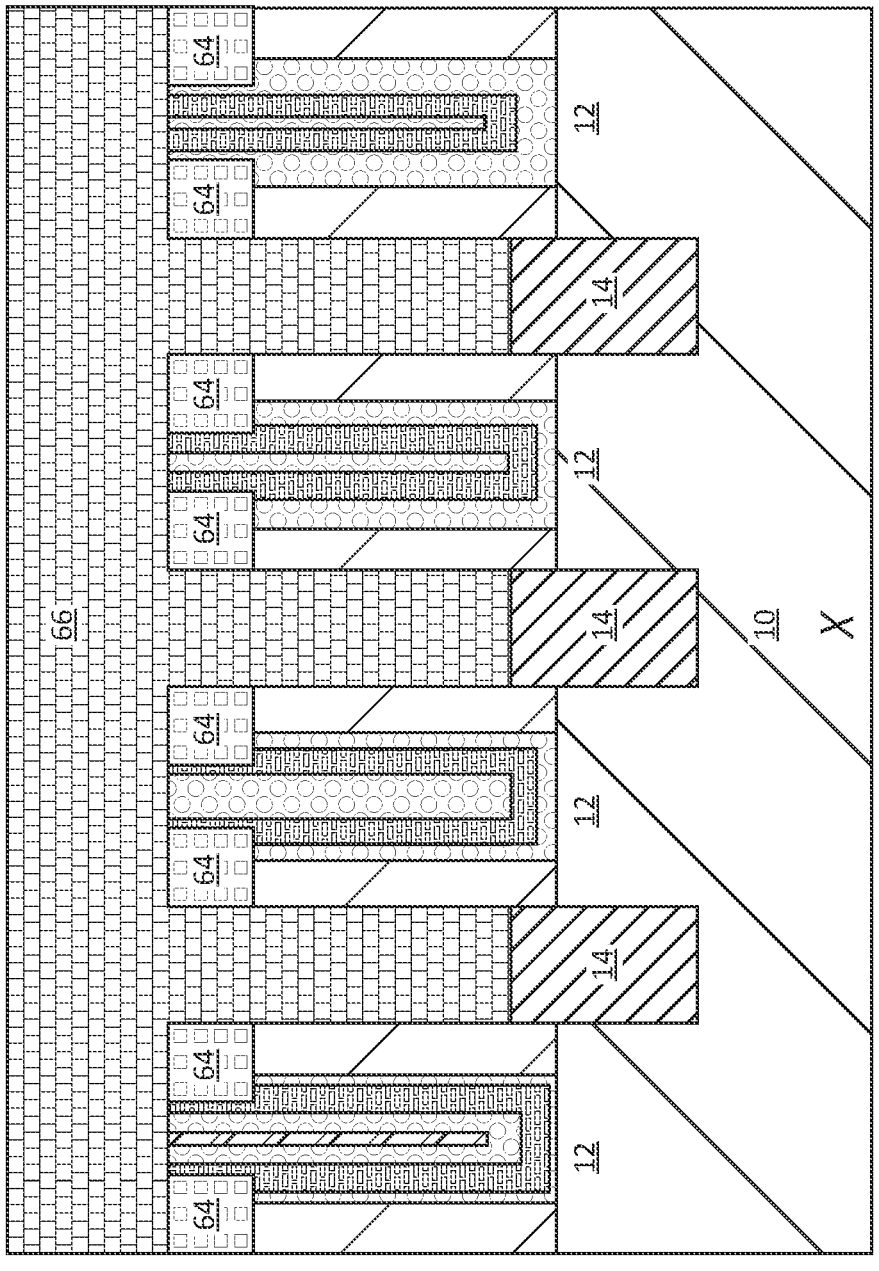
FIG. 4 is a cross-sectional view of the semiconductor structure of FIG. 3 where a dielectric is deposited in areas created by the isotropic etch and a first interlayer dielectric (ILD) is deposited over the structure, in accordance with an embodiment of the present invention.

FIG. 4 is a cross-sectional view of the semiconductor structure of FIG. 3 where a dielectric is deposited in areas created by the isotropic etch and a first interlayer dielectric (ILD) is deposited over the structure, in accordance with an embodiment of the present invention.

In various example embodiments, a dielectric 64 is deposited in areas created by the isotropic etch and a first interlayer dielectric (ILD) 66 is deposited over the structure.

The dielectric 64 can be planarized before deposition of the first ILD 66. The dielectric 64 can also be referred to as a top spacer.

Regarding various dielectrics or dielectric layers (such as the dielectric 64) discussed herein, the dielectrics can include, but are not limited to, SiN, SiOCN, SiOC, SiC, SiON, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectrics can be conformally deposited using atomic layer deposition (ALD) or, chemical vapor deposition (CVD). Variations of CVD processes suitable for forming the dielectrics include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

The first ILD 66 includes a different material than the dielectric 64.

The first ILD 66 can be any suitable material, such as, for example, porous silicates, carbon doped oxides, silicon dioxides, silicon nitrides, silicon oxynitrides, or other dielectric materials. Any known manner of forming the first ILD 66 can be utilized. The first ILD 66 can be formed using, for example, CVD, PECVD, ALD, flowable CVD, spin-on dielectrics, or PVD.

Figure 5:
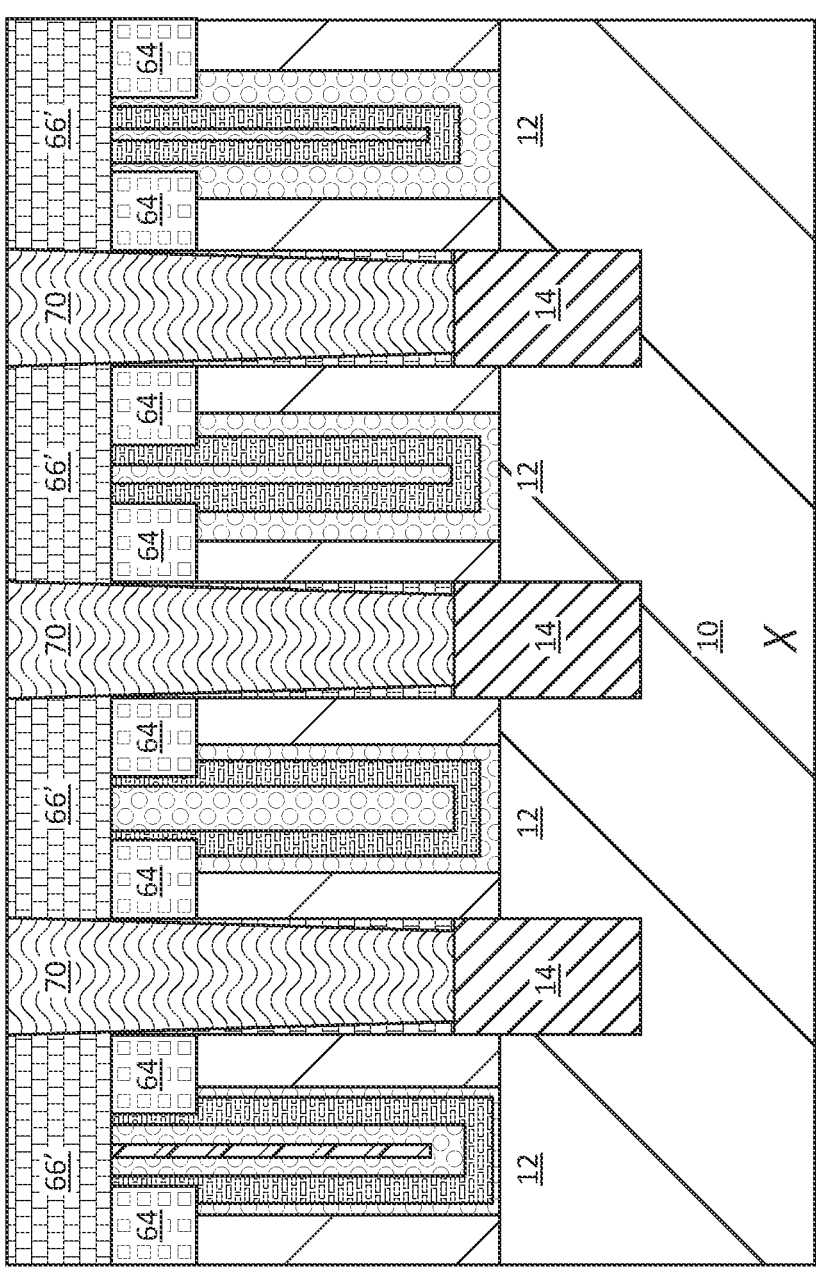
FIG. 5 is a cross-sectional view of the semiconductor structure of FIG. 4 where source/drain (S/D) contacts are formed, in accordance with an embodiment of the present invention.

FIG. 5 is a cross-sectional view of the semiconductor structure of FIG. 4 where source/drain (S/D) contacts are formed, in accordance with an embodiment of the present invention.

In various example embodiments, source/drain (S/D) contacts 70 are formed to the top surface of the S/D epi regions 14. The S/D contacts 70 can also be referred to as CA contacts. The S/D contacts 70 are formed between the NLVT, NRVT, PRVT, and PLVT devices. The sidewalls of the S/D contacts 70 do not directly contact the sidewalls of the spacers 18. The remaining first ILD 66 is designated as first ILD portions 66'.

Non-limiting examples of suitable conductive materials for the S/D contacts 70 include a silicide liner such as Ti, Ni, NiPt, etc., an adhesion metal liner, such as TiN, TaN, and conductive metal fill, such as Al, W, Co, Ru, etc. The conductive material can further include dopants that are incorporated during or after deposition. The conductive metal can be deposited by a suitable deposition process, for example, CVD, PECVD, PVD, plating, thermal or e-beam evaporation, and sputtering.

Figure 6:
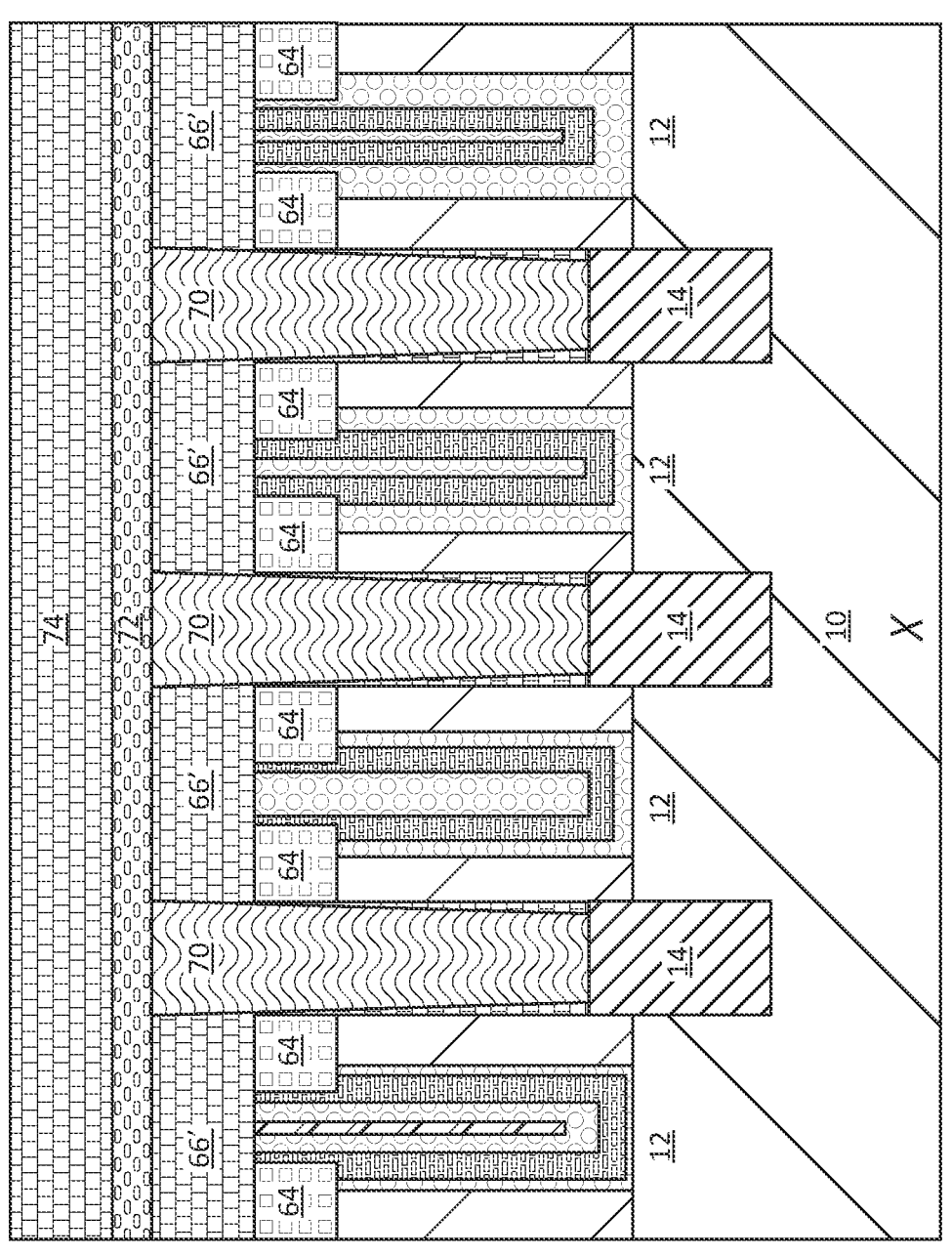
FIG. 6 is a cross-sectional view of the semiconductor structure of FIG. 5 where an etch stop layer is deposited and a second ILD is formed over the etch stop layer, in accordance with an embodiment of the present invention.

FIG. 6 is a cross-sectional view of the semiconductor structure of FIG. 5 where an etch stop layer is deposited and a second ILD is formed over the etch stop layer, in accordance with an embodiment of the present invention.

In various example embodiments, an etch stop layer 72 is deposited and a second ILD 74 is formed over the etch stop layer 72.

The dielectric of the etch stop layer 72 can include, but is not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the dielectric of the etch stop layer 72 can be conformally deposited using atomic layer deposition (ALD) or, chemical vapor deposition (CVD). Variations of CVD processes suitable for forming the etch stop layer 72 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 7:
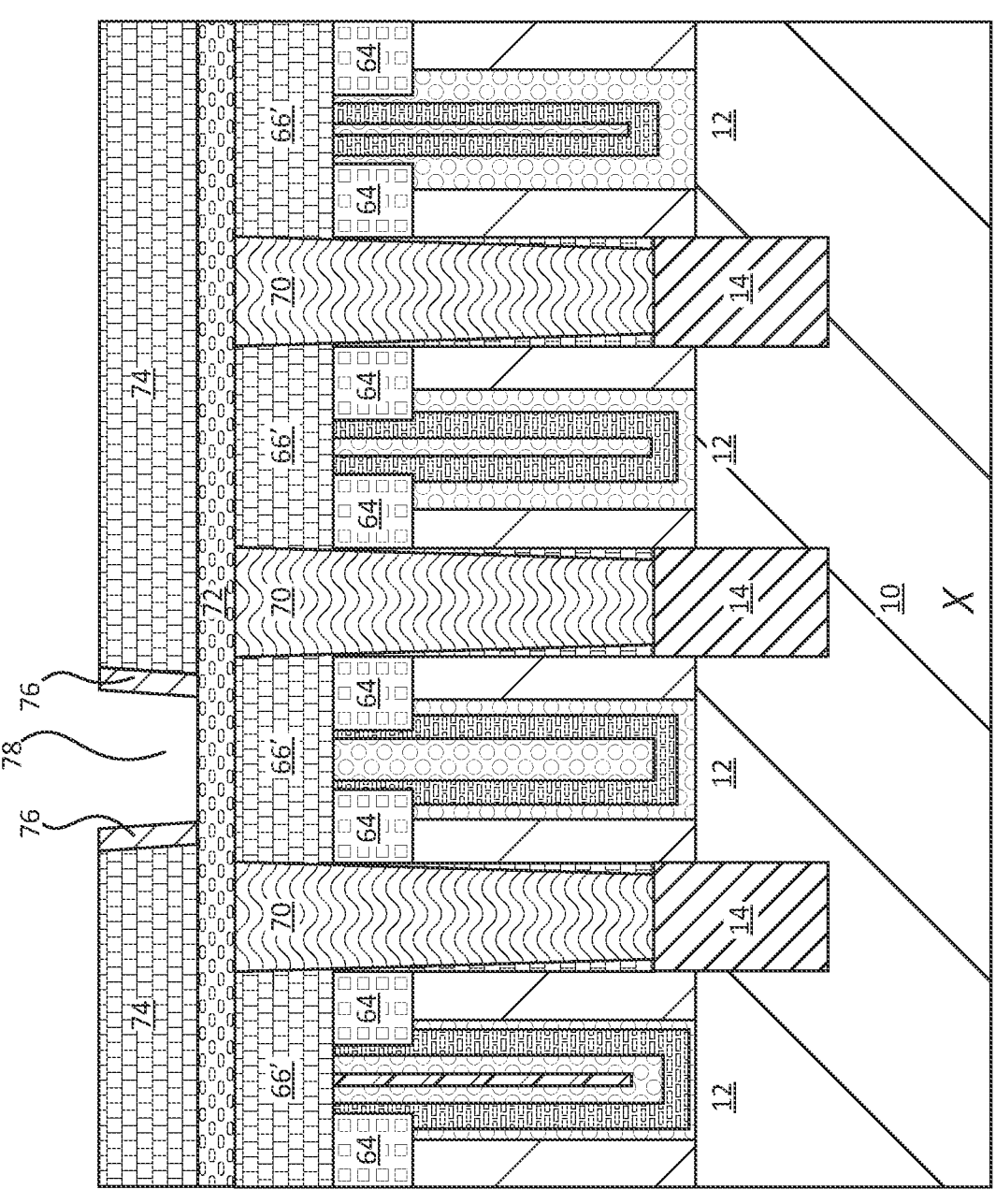
FIG. 7 is a cross-sectional view of the semiconductor structure of FIG. 6 where the second ILD is selectively etched to create an opening over a gate region and inner spacers are formed within the opening, in accordance with an embodiment of the present invention.

FIG. 7 is a cross-sectional view of the semiconductor structure of FIG. 6 where the second ILD is selectively etched to create an opening over a gate region and inner spacers are formed within the opening, in accordance with an embodiment of the present invention.

In various example embodiments, the second ILD 74 is selectively etched to create an opening 78 over the NRVT device. The opening 78 terminates at the top surface of the etch stop layer 72. Inner spacers 76 are formed within the opening 78. The inner spacers 76 accommodate the CPP shrink and gate top CD reduction. The inner spacers 76 are vertically aligned with the dielectric 64 of the NRVT device. The inner spacers 76 are also vertically aligned with the spacers 18 of the NRVT device.

The inner spacers 76 can include any of one or more of SiN, SiBN, SiCN and/or SiBCN films.

Figure 8:
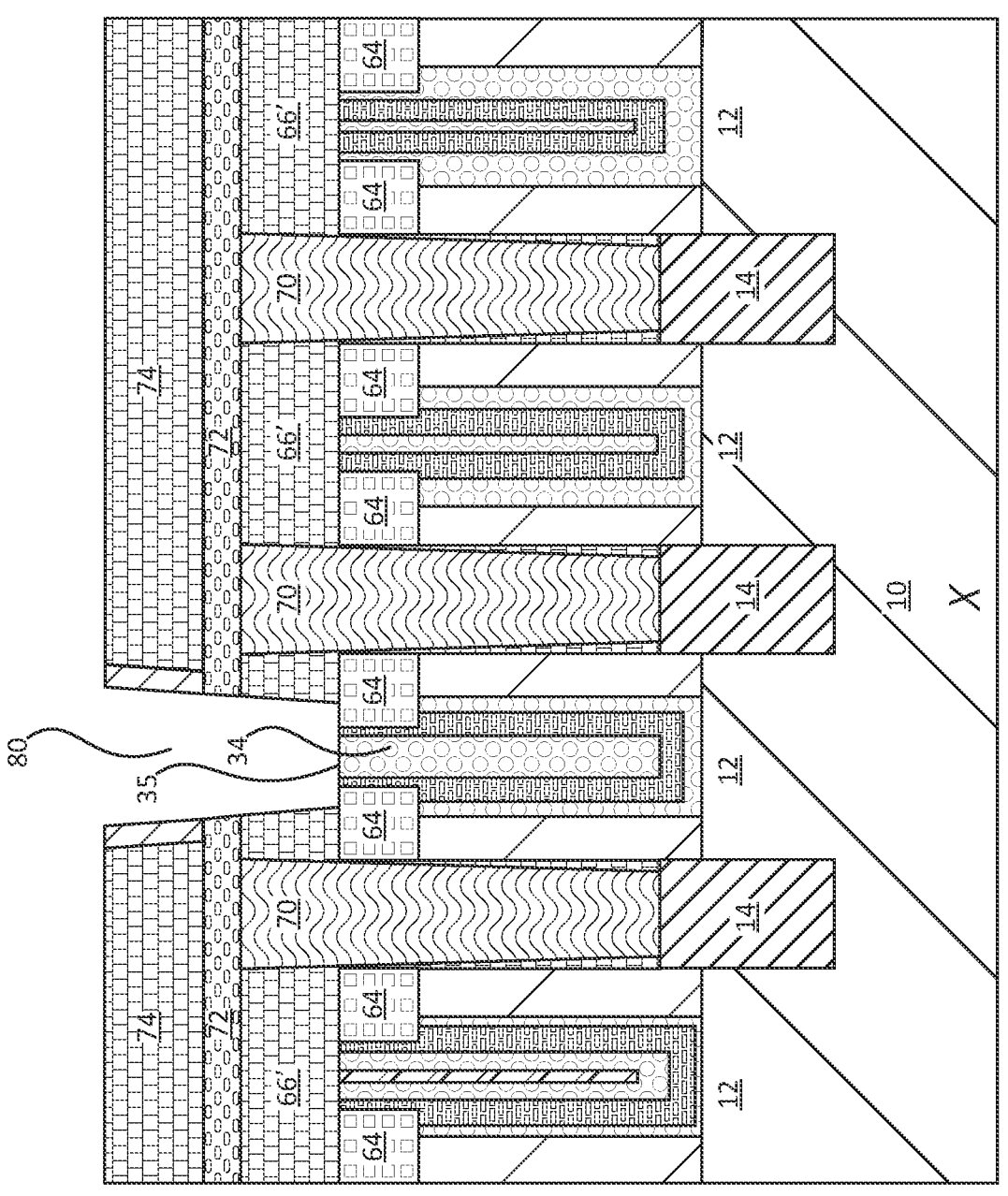
FIG. 8 is a cross-sectional view of the semiconductor structure of FIG. 7 where the etch stop layer and the first ILD are etched to create an opening to a gate, in accordance with an embodiment of the present invention.

FIG. 8 is a cross-sectional view of the semiconductor structure of FIG. 7 where the etch stop layer and the first ILD are etched to create an opening to a gate, in accordance with an embodiment of the present invention.

In various example embodiments, the etch stop layer 72 and the first ILD portion 66' of the NRVT device are etched to create an opening 80 to a top surface 35 of the NRVT device. The thin recessed second WFM layer 32' and the third WFM layer 34 are exposed.

Figure 9:
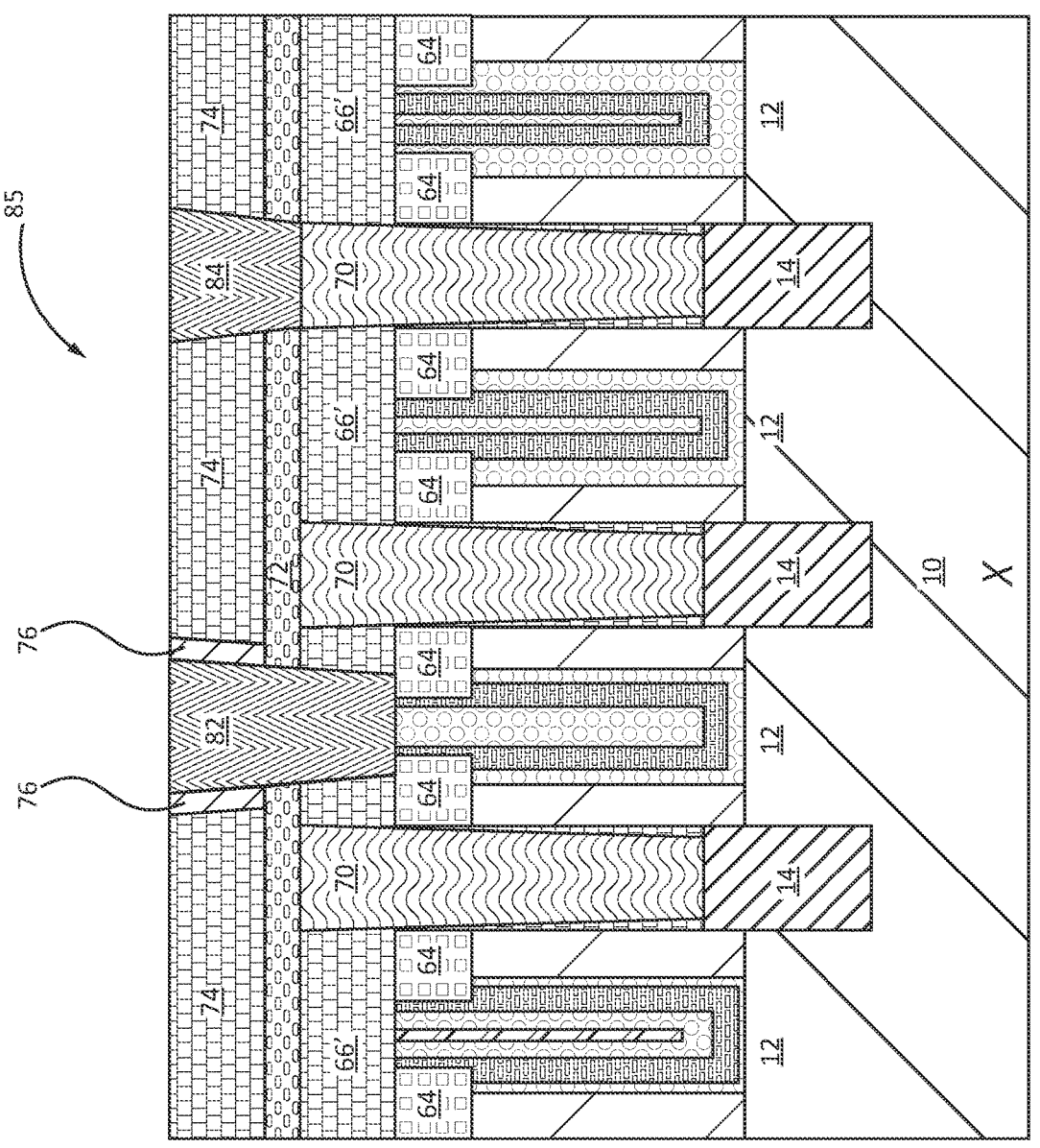
FIG. 9 is a cross-sectional view of the semiconductor structure of FIG. 8 where metallization takes place to form a CB contact and a VA contact, in accordance with an embodiment of the present invention.

FIG. 9 is a cross-sectional view of the semiconductor structure of FIG. 8 where metallization takes place to form a CB contact and a VA contact, in accordance with an embodiment of the present invention.

In various example embodiments, metallization takes place to form a CB contact 82 and a VA contact 84. The CB contact 82 can also be referred to as a gate contact. The final semiconductor structure 85 illustrates the CB contact 82 directly contacting the top surfaces of the thin recessed second WFM layer 32' and the third WFM layer 34. The CB contact 82 also directly contacts top surfaces of the dielectric 64 of the NRVT device. The dielectric 64 can also be referred to as a top spacer. The CB contact 82 directly contacts sidewalls of the inner spacers 76. The VA contact 84 directly contacts the top surface of the S/D contact 70 in the PLVT device. The CB contact 82 is vertically offset from the S/D epi regions 14, whereas the VA contact 84 is vertically aligned with the S/D epi region 14. Each of the NLVT, NRVT, PRVT, and PLVT devices has a different threshold voltage.

The final semiconductor structure 85 thus includes a plurality of field effect transistor (FET) devices, each FET device having a different gate threshold voltage, first spacers (the spacers 18) disposed on sidewalls of each FET device, second spacers (or top spacers or the dielectric 64) disposed over and in direct contact with the first spacers, the second spacers having a width greater than a width of the first spacers, and the gate contact or the CB contact 82 directly contacting an FET device of the plurality of FET devices, where only an upper portion of the CB contact 82 directly contacts third spacers (the inner spacers 76) on opposed ends thereof.

The FET device directly contacting the CB contact 82 includes a first work function metal (WFM) layer 30, a second WFM layer 32, and a third WFM layer 34. The first WFM layer 30 directly contacts sidewalls of the first spacers (the spacers 18) and the second WFM layer 32 directly contacts sidewalls of the second spacers (top spacers or the dielectric 64). The third WFM layer 34 rests within the second WFM layer 32. The third WFM layer 34 directly contacts a bottom surface of the CB contact 82. The third spacers (the inner spacers 76) are vertically aligned with the first spacers and the second spacers. Moreover, the second spacers directly contact an upper portion of the FET device directly contacting the CB contact 82.

Non-limiting examples of suitable conductive materials for the CB contact 82 and the VA contact 84 include a silicide liner such as Ti, Ni, NiPt, etc., an adhesion metal liner, such as TiN, TaN, and conductive metal fill, such as Al, W, Co, Ru, etc. The conductive material can further include dopants that are incorporated during or after deposition. The conductive metal can be deposited by a suitable deposition process, for example, CVD, PECVD, PVD, plating, thermal or e-beam evaporation, and sputtering.

Figure 10:
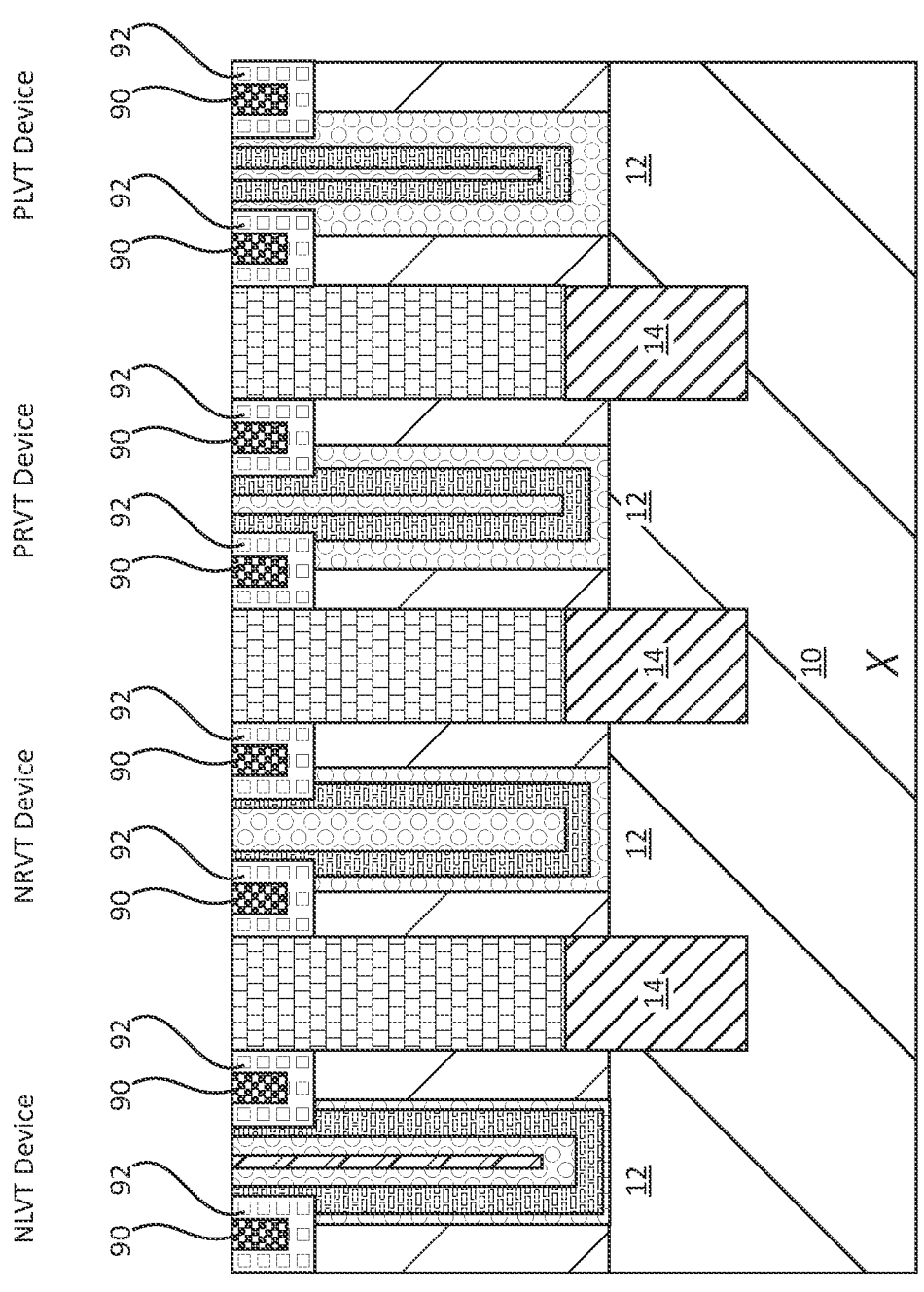
FIG. 10 is a cross-sectional view of the semiconductor structure of FIG. 3 where a bi-layer dielectric is deposited in areas created by the isotropic etch, in accordance with another embodiment of the present invention.

FIG. 10 is a cross-sectional view of the semiconductor structure of FIG. 3 where a bi-layer dielectric is deposited in areas created by the isotropic etch, in accordance with another embodiment of the present invention.

In various example embodiments, a bi-layer dielectric is deposited in areas created by the isotropic etch of FIG. 3. The bi-layer dielectric includes a first dielectric layer 90 and a second dielectric layer 92. The first dielectric layer 90 rests within the second dielectric layer 92. The second dielectric layer 92 has a substantially U-shaped configuration. The first and second dielectric layers 90, 92 can be planarized. In one example, the first dielectric layer 90 can be SiC and the second dielectric layer 92 can be SiN, or vice versa.

Figure 11:
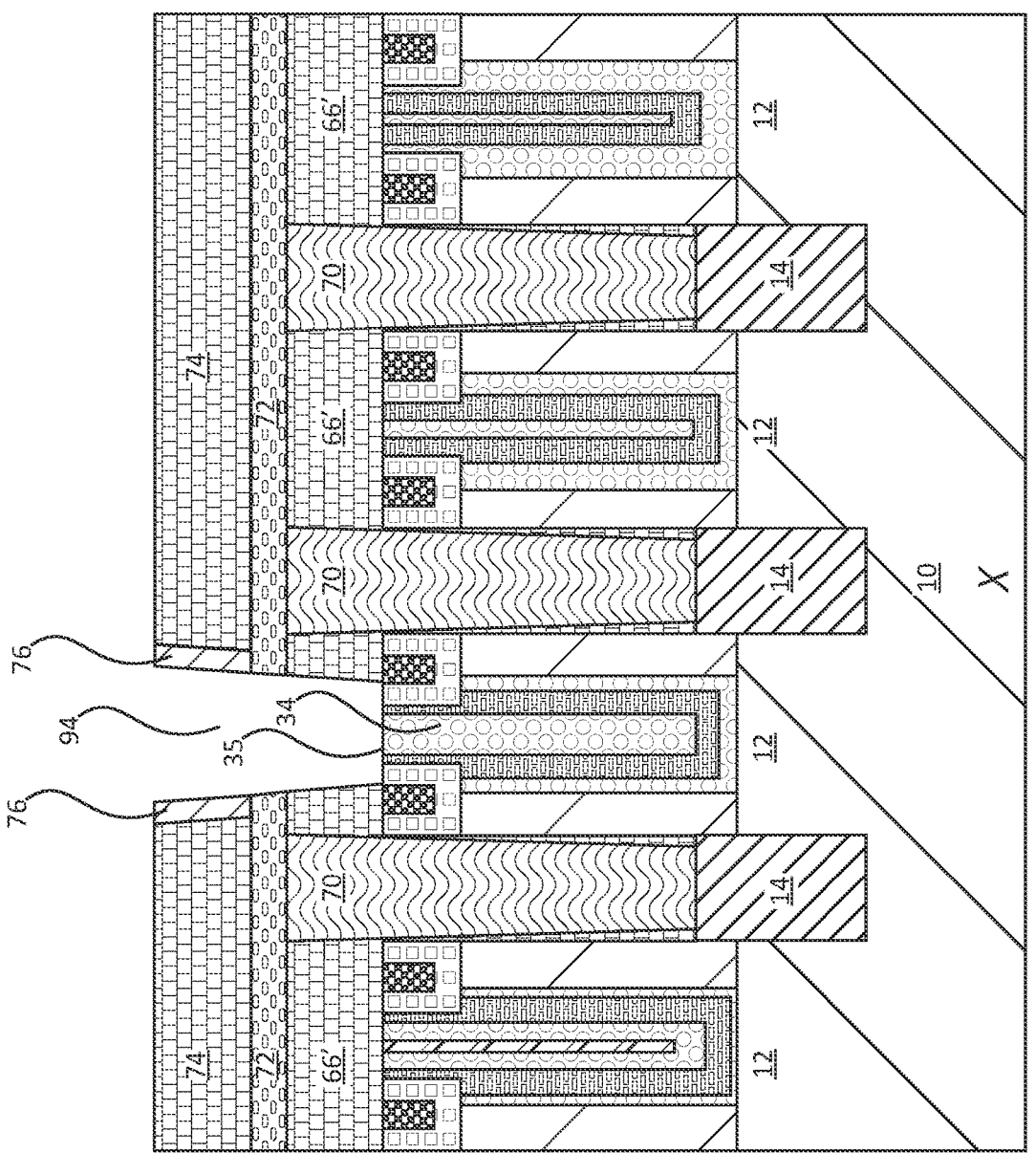
FIG. 11 is a cross-sectional view of the semiconductor structure of FIG. 10 where S/D contacts are formed, a first ILD, an etch stop layer, and a second ILD are deposited, and an opening is created to a top surface of a device, in accordance with an embodiment of the present invention.

FIG. 11 is a cross-sectional view of the semiconductor structure of FIG. 10 where S/D contacts are formed, a first ILD, an etch stop layer, and a second ILD are deposited, and an opening is created to a top surface of a device, in accordance with an embodiment of the present invention.

In various example embodiments, the S/D contacts 70 are formed, the first ILD 66 with the first ILD portions 66', the etch stop layer 72, and the second ILD 74 are deposited, and an opening 94 is created to a top surface 35 of the NRVT device to expose the thin recessed second WFM layer 32' and the third WFM layer 34. A top surface of the second dielectric layer 92 is also exposed. Stated differently, the sections of the second dielectric layer 92 that directly contact the sidewalls of the thin recessed second WFM layer 32' are exposed.

Figure 12:
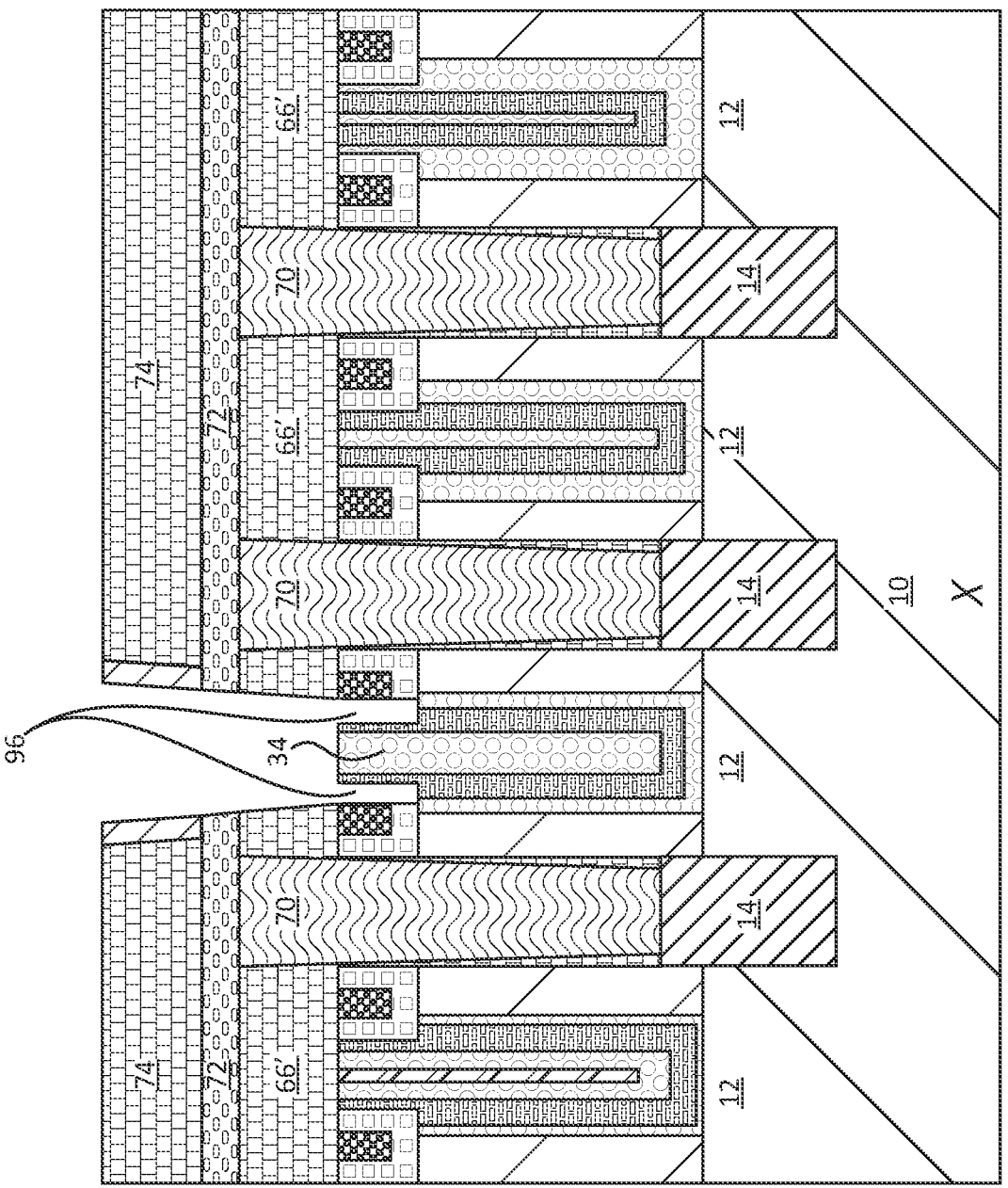
FIG. 12 is a cross-sectional view of the semiconductor structure of FIG. 11 where portions of the bi-layer dielectric are selectively etched, in accordance with an embodiment of the present invention.

FIG. 12 is a cross-sectional view of the semiconductor structure of FIG. 11 where portions of the bi-layer dielectric are selectively etched, in accordance with an embodiment of the present invention.

In various example embodiments, portions of the bi-layer dielectric are selectively etched. In particular, the sections of the second dielectric layer 92 that directly contact the sidewalls of the thin recessed second WFM layer 32' are removed to create openings 96. The openings 96 extend to a top surface of the first WFM layer 30 of the NRVT device. The openings 96 can be referred to as extensions or projections along the top area or top section of the NRVT device.

Figure 13:
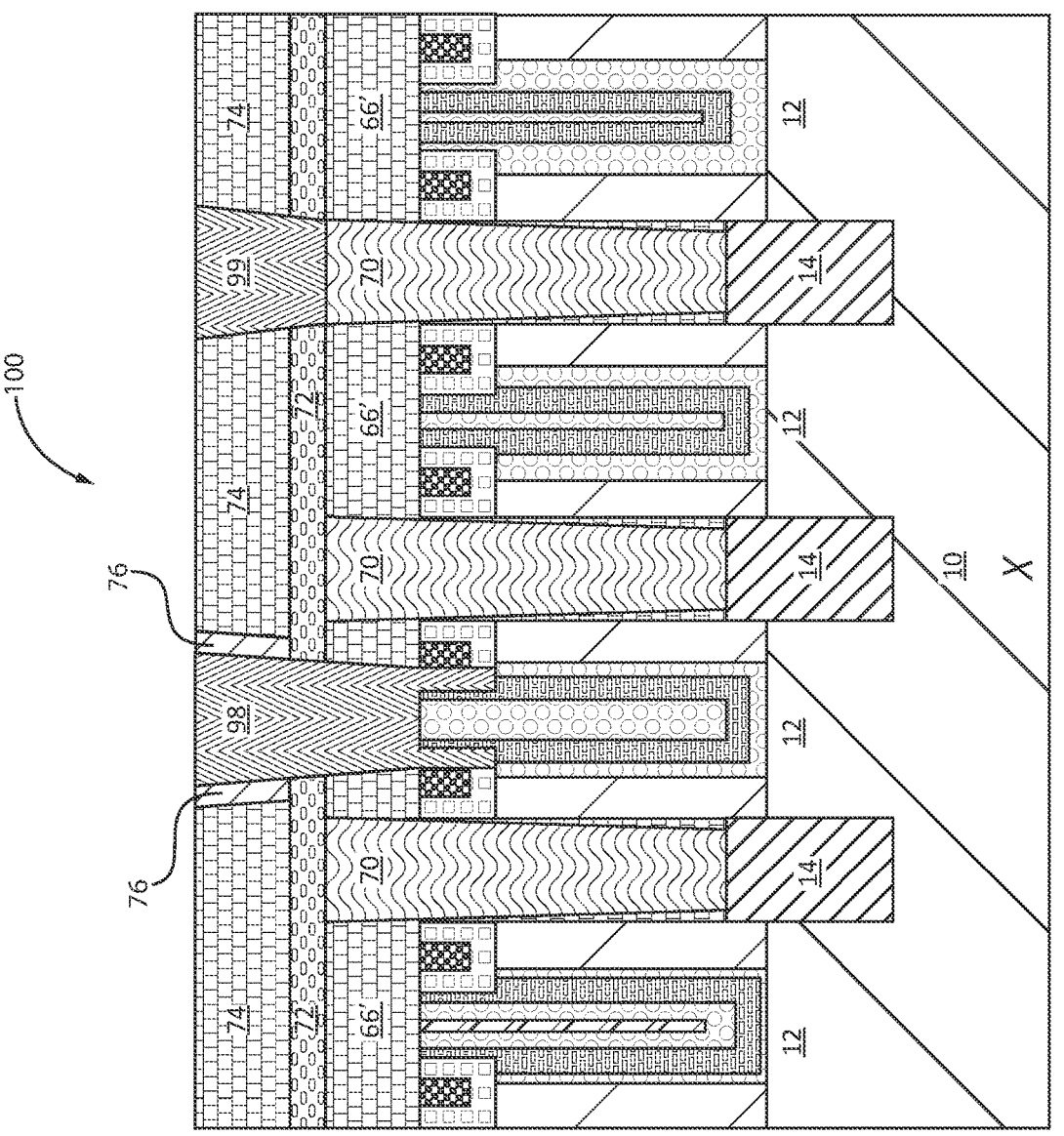
FIG. 13 is a cross-sectional view of the semiconductor structure of FIG. 12 where metallization takes place to form a CB contact and a VA contact, in accordance with an embodiment of the present invention.

FIG. 13 is a cross-sectional view of the semiconductor structure of FIG. 12 where metallization takes place to form a CB contact and a VA contact, in accordance with an embodiment of the present invention.

In various example embodiments, where metallization takes place to form a CB contact 98 and a VA contact 99. The final semiconductor structure 100 illustrates the CB contact 98 directly contacting the top surfaces of the thin recessed second WFM layer 32' and the third WFM layer 34. The CB contact 98 also directly contacts sidewalls of the first dielectric material 90 and the second dielectric material 92. The CB contact 98 also directly contacts sidewalls of the thin recessed second WFM layer 32'. In contrast to the CB contact 82 of FIG. 9, the CB contact 98 of the structure 100 extends further down into the WFM layers of the NRVT device. The CB contact 98 encapsulates or surrounds or wraps around top areas of the WFM layers of the NRVT device. The CB contact 98 thus includes extension regions or projections that wrap around the top portion of the NRVT device.

The bi-layer dielectric including the first and second dielectric layers 90, 92 can also be referred to as a top spacer. The CB contact 98 directly contacts sidewalls of the inner spacers 76. The VA contact 99 directly contacts the top surface of the S/D contact 70 in the PLVT device. The CB contact 98 is vertically offset from the S/D epi regions 14, whereas the VA contact 99 is vertically aligned with the S/D epi region 14. Each of the NLVT, NRVT, PRVT, and PLVT devices has a different gate threshold voltage.

The final semiconductor structure 100 includes a plurality of field effect transistor (FET) devices, each FET device having a different gate threshold voltage, first spacers (the spacers 18) disposed on sidewalls of each FET device, second spacers (top spacers or the dielectric 64) disposed over and in direct contact with the first spacers, the second spacers having a bi-layer configuration (the first dielectric layer 90 and the second dielectric layer 92), and the gate contact or CB contact 98 directly contacting an FET device of the plurality of FET devices, where only an upper portion of the CB contact 98 directly contacts third spacers (the inner spacers 76) on opposed ends thereof.

The second spacers have a width greater than a width of the first spacers. The CB contact 98 wraps around a top portion of the FET device directly contacting the CB contact. The FET device directly contacting the CB contact 98 includes a first work function metal (WFM) layer 30, a second WFM layer 32, and a third WFM layer 34. The first WFM layer 30 directly contacts sidewalls of the first spacers. The gate contact 98 directly contacts sidewalls of the second WFM layer 32. The third WFM layer 34 rests within the second WFM layer 32 and the third WFM layer 34 directly contacts a bottom surface of the CB contact 98. The second spacers have the bi-layer configuration directly contacting the sidewalls of the CB contact 98. A bottommost surface of the CB contact 98 directly contacts top surfaces of both the first and second WFM layers 30, 32.

Thus, with respect to FIGS. 9 and 13, a semiconductor structure or a contact structure is presented including a gate with a reduced dimension on a top portion thereof, and a top spacer with a larger width over the sidewall spacer. In one example, as in FIG. 13, the top spacer can have a bi-layer configuration where the inner spacer is composed of a different material than the material of the outer spacer. Moreover, the contact structure can include a gate contact with an inner dielectric spacer on top, and no inner spacers at the bottom, the gate contact landing over the gate with a reduced dimension on top, with a wrap-around configuration. The method of constructing the contact structure includes the steps of forming a divot or opening next to the WFM by recessing the sidewall spacer, enlarging the divot by isotropically trimming the WFM, filling the divot or opening with a bi-layer dielectric where the first layer can be selectively etched to the second layer, depositing a first MOL ILD and forming a S/D contact, depositing an etch stop layer and a second MOL ILD, forming a two-stage gate contact which has inner spacers in the second MOL ILD and no-inner spacers in the first MOL ILD, further etching away the first layer dielectric in the divot or opening under the gate contact, and performing gate metallization.

In conclusion, the exemplary embodiments of the present invention introduce reduced gate top CDs with a wrap-around gate contact. The exemplary methods and structure are enabled by forming a reduced gate top CD by employing a local enlarged gate spacer and a reduced gate contact CD by employing inner spacers, as well as constructing a wrap-around gate contact for MOL scaling. The exemplary embodiments of the present invention achieve a similar MOL litho process window at 45 CPP compared to existing technology at 51 CPP. The exemplary embodiments can even make 42 CPP possible. The advantages of the exemplary embodiments of the present invention include at least not needing aggressive Lg reduction, which compromises SCE, and not needing aggressive CA size reduction, which compromises $R_{on}$. Moreover, the exemplary structures only shrink the top gate CD and CB size, parameters which affect performance the least. However, the weakness of only shrinking the top gate CD and CB size can be mitigated by using a bi-layer top spacer followed by selectively removing the first layer after CB RIE to recover the CB to gate contact dimension.

Regarding FIGS. 1-13, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and structures providing for reduced gate top CDs with a wraparound gate contact (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:

a plurality of field effect transistor (FET) devices, each of the plurality of FET devices having a different gate threshold voltage;

first spacers disposed on opposed ends of each of the plurality of FET devices;

second spacers disposed over and in direct contact with the first spacers, the second spacers having a width greater than a width of the first spacers;

third spacers disposed in an interlayer dielectric; and a gate contact directly contacting one of the plurality of FET devices, wherein only an upper portion of the gate contact directly contacts third spacers on opposed ends of the upper portion of the gate contact.

2. The semiconductor structure of claim 1, wherein the one of the plurality of FET devices directly contacting the gate contact includes a first work function metal (WFM) layer, a second WFM layer, and a third WFM layer.

3. The semiconductor structure of claim 2, wherein the first WFM layer directly contacts sidewalls of the first spacers and the second WFM layer directly contacts sidewalls of the second spacers.

4. The semiconductor structure of claim 2, wherein the third WFM layer rests within the second WFM layer.

5. The semiconductor structure of claim 2, wherein the third WFM layer directly contacts a bottom surface of the gate contact.

6. The semiconductor structure of claim 1, wherein the third spacers are vertically aligned with the first spacers and the second spacers.

7. The semiconductor structure of claim 1, wherein the second spacers directly contact an upper portion of the one of the plurality of FET devices that is directly contacting the gate contact.

8. A method comprising:

constructing a plurality of field effect transistor (PET) devices, each of the plurality of FET devices having a different gate threshold voltage;

forming first spacers on opposed ends of each of the plurality of FET devices;

forming second spacers over and in direct contact with the first spacers, the second spacers having a width greater than a width of the first spacers;

forming third spacers in an opening of an interlayer dielectric; and disposing a gate contact in direct contact with one of the plurality of FET devices, wherein only an upper portion of the gate contact directly contacts third spacers on opposed ends the upper portion of the gate contact.

9. The method of claim 8, wherein the second spacers have a bi-layer configuration.

10. The method of claim 8, wherein the gate contact wraps around a top portion of the one of the plurality of FET devices in direct contact with the gate contact.

* * * * *